(12) United States Patent
Toyama et al.

(10) Patent No.: US 11,758,730 B2
(45) Date of Patent: Sep. 12, 2023

(54) BONDED ASSEMBLY OF A MEMORY DIE AND A LOGIC DIE INCLUDING LATERALLY SHIFTED BIT-LINE BONDING PADS AND METHODS OF FORMING THE SAME

(71) Applicant: SANDISK TECHNOLOGIES LLC, Addison, TX (US)

(72) Inventors: Fumiaki Toyama, Cupertino, CA (US); Jee-Yeon Kim, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 214 days.

(21) Appl. No.: 17/315,938

(22) Filed: May 10, 2021

(65) Prior Publication Data
US 2022/0359555 A1    Nov. 10, 2022

(51) Int. Cl.
| | |
|---|---|
| H01L 25/065 | (2023.01) |
| H10B 43/40 | (2023.01) |
| G11C 11/408 | (2006.01) |
| H10B 43/27 | (2023.01) |

(52) U.S. Cl.
CPC .......... *H10B 43/40* (2023.02); *G11C 11/4085* (2013.01); *H01L 25/0657* (2013.01); *H10B 43/27* (2023.02); *H01L 2225/06541* (2013.01)

(58) Field of Classification Search
CPC ................................. H10B 43/40; H10B 43/27
See application file for complete search history.

(56) References Cited

U.S. PATENT DOCUMENTS

| | | |
|---|---|---|
| 5,915,167 A | 6/1999 | Leedy |
| 8,378,892 B2 | 2/2013 | Sorvala et al. |
| 10,115,681 B1 | 10/2018 | Ariyoshi |
| 10,283,493 B1 | 5/2019 | Nishida |
| 10,354,980 B1 | 7/2019 | Mushiga et al. |
| 10,354,987 B1 | 7/2019 | Mushiga et al. |
| 10,381,322 B1 | 8/2019 | Azuma et al. |
| 10,381,362 B1 | 8/2019 | Cui et al. |
| 10,510,738 B2 | 12/2019 | Kim et al. |
| 10,629,616 B1 | 4/2020 | Kai et al. |
| 10,665,580 B1 | 5/2020 | Hosoda et al. |
| 10,665,581 B1 | 5/2020 | Zhou et al. |

(Continued)

OTHER PUBLICATIONS

U.S. Appl. No. 16/682,848, filed Nov. 13, 2019, SanDisk Technologies LLC.

(Continued)

*Primary Examiner* — Trang Q Tran
(74) *Attorney, Agent, or Firm* — THE MARBURY LAW GROUP PLLC

(57) ABSTRACT

A bonded assembly of a memory die and a logic die is provided. The memory die includes a memory array, a plurality of bit lines, and memory-side bit-line-connection bonding pads. The logic die includes sense amplifiers located in a sense amplifier region, and logic-side bit-line-connection bonding pads located within the sense amplifier region and bonded to a respective one of the memory-side bit-line-connection bonding pads. The sense amplifier region has an areal overlap with a respective first subset the plurality of bit lines in a plan view, while a second subset of the plurality of bit lines does not have an areal overlap with the sense amplifier region in the plan view.

19 Claims, 13 Drawing Sheets

(56) References Cited

U.S. PATENT DOCUMENTS

| | | |
|---|---|---|
| 10,714,497 B1 | 7/2020 | Nishida et al. |
| 10,727,216 B1 | 7/2020 | Kai et al. |
| 10,741,535 B1 | 8/2020 | Nishikawa et al. |
| 10,790,296 B1 | 9/2020 | Yamaha et al. |
| 10,797,035 B1 | 10/2020 | Sano et al. |
| 10,797,062 B1 | 10/2020 | Nishikawa et al. |
| 10,804,202 B2 | 10/2020 | Nishida |
| 10,811,058 B2 | 10/2020 | Zhang et al. |
| 10,854,573 B2 | 12/2020 | Ji et al. |
| 10,861,873 B2 | 12/2020 | Kim et al. |
| 10,872,899 B2 | 12/2020 | Kim et al. |
| 10,879,260 B2 | 12/2020 | Uryu et al. |
| 10,910,272 B1 | 2/2021 | Zhou et al. |
| 10,957,680 B2 | 3/2021 | Yada et al. |
| 10,957,705 B2 | 3/2021 | Totoki et al. |
| 10,985,169 B2 | 4/2021 | Kai et al. |
| 2008/0088511 A1 | 4/2008 | Sorvala et al. |
| 2016/0079164 A1 | 3/2016 | Fukuzumi et al. |
| 2019/0019838 A1 | 1/2019 | Kropelnicki et al. |
| 2019/0088676 A1 | 3/2019 | Tagami et al. |
| 2019/0221557 A1 | 7/2019 | Kim et al. |
| 2019/0252361 A1 | 8/2019 | Nishida |
| 2020/0066745 A1 | 2/2020 | Yu et al. |
| 2020/0286815 A1 | 9/2020 | Moriyama et al. |
| 2020/0286875 A1* | 9/2020 | Nishida .................. H01L 25/50 |
| 2020/0335513 A1 | 10/2020 | Morozumi et al. |
| 2020/0343161 A1 | 10/2020 | Wu et al. |
| 2020/0395350 A1 | 12/2020 | Wu et al. |
| 2021/0028148 A1 | 1/2021 | Wu et al. |
| 2021/0028149 A1 | 1/2021 | Makala et al. |
| 2021/0057336 A1 | 2/2021 | Shao et al. |
| 2021/0066317 A1 | 3/2021 | Wu et al. |
| 2021/0098029 A1 | 4/2021 | Kim et al. |
| 2021/0126008 A1 | 4/2021 | Tanabe et al. |
| 2021/0134819 A1 | 5/2021 | Zhang et al. |
| 2021/0134827 A1 | 5/2021 | Iwai et al. |
| 2021/0233900 A1 | 7/2021 | Kim et al. |
| 2021/0375847 A1 | 12/2021 | Chibvongodze et al. |

OTHER PUBLICATIONS

U.S. Appl. No. 16/694,340, filed Nov. 25, 2019, SanDisk Technologies LLC.

U.S. Appl. No. 16/694,400, filed Nov. 25, 2019, SanDisk Technologies LLC.

U.S. Appl. No. 16/694,438, filed Nov. 25, 2019, SanDisk Technologies LLC.

U.S. Appl. No. 16/728,327, filed Dec. 27, 2019, SanDisk Technologies LLC.

U.S. Appl. No. 16/742,213, filed Jan. 14, 2020, SanDisk Technologies LLC.

U.S. Appl. No. 16/747,943, filed Jan. 21, 2020, SanDisk Technologies LLC.

U.S. Appl. No. 16/774,372, filed Jan. 28, 2020, SanDisk Technologies LLC.

ISR—Notification of Transmittal of The International Search Report and Written Opinion of the International Searching Authority for International Patent Application No. PCT/US2022/013285, dated Apr. 5, 2022, 13 pages.

* cited by examiner

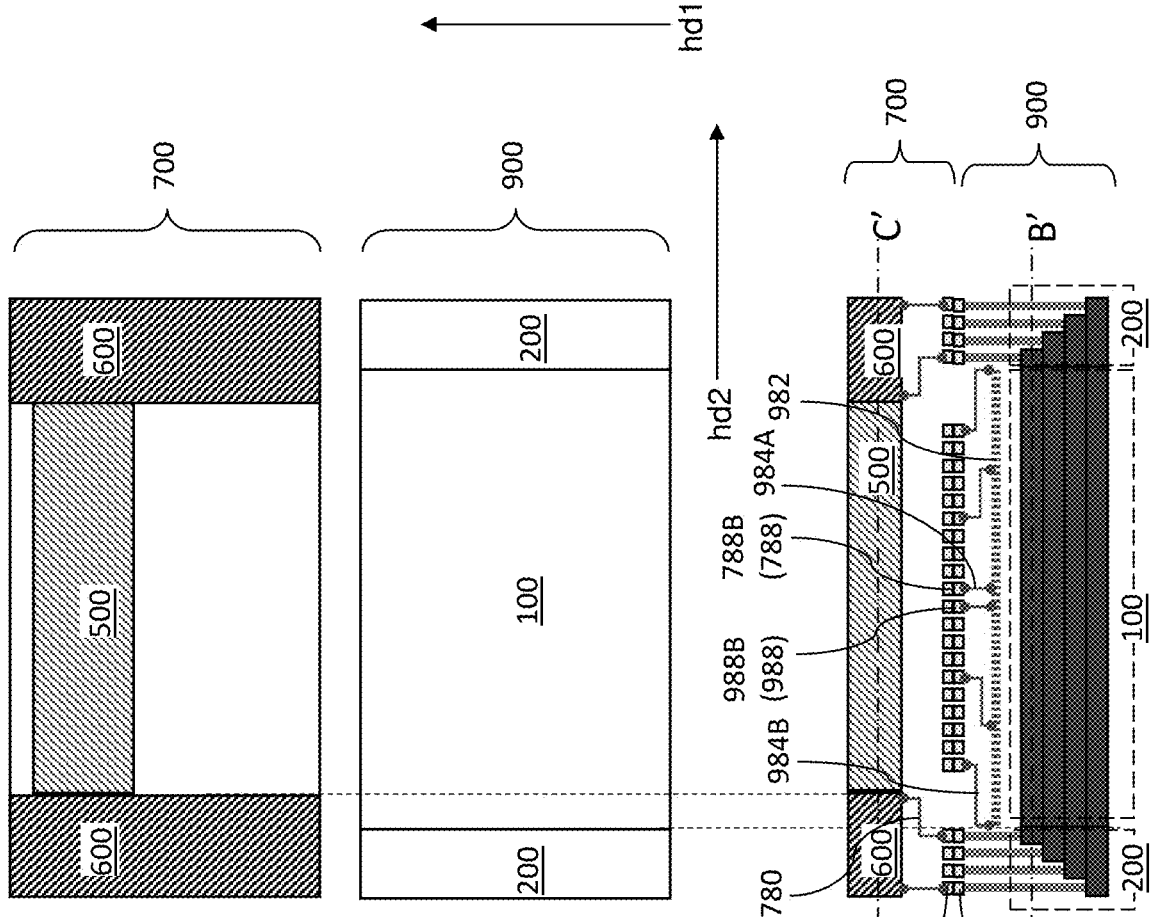

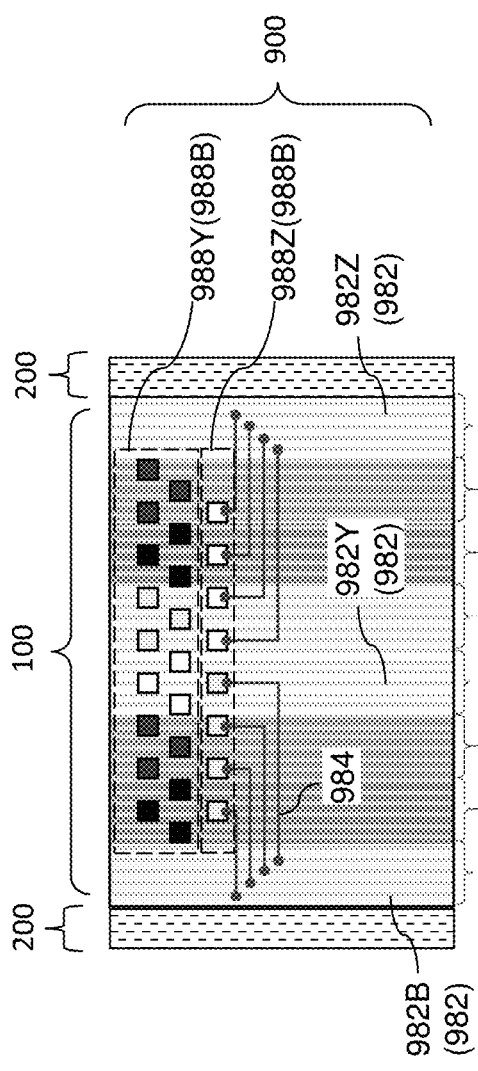
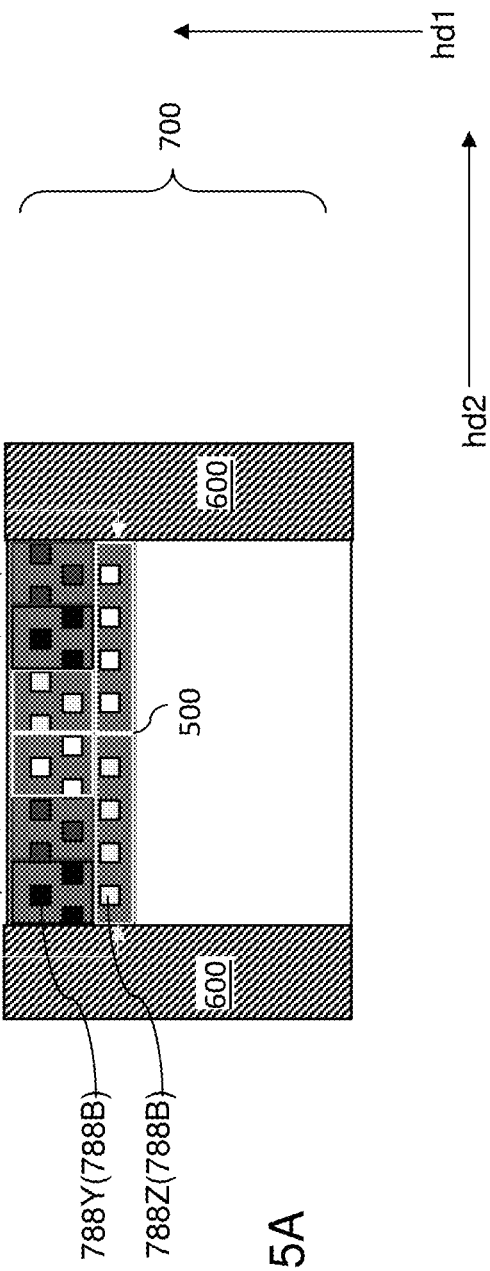

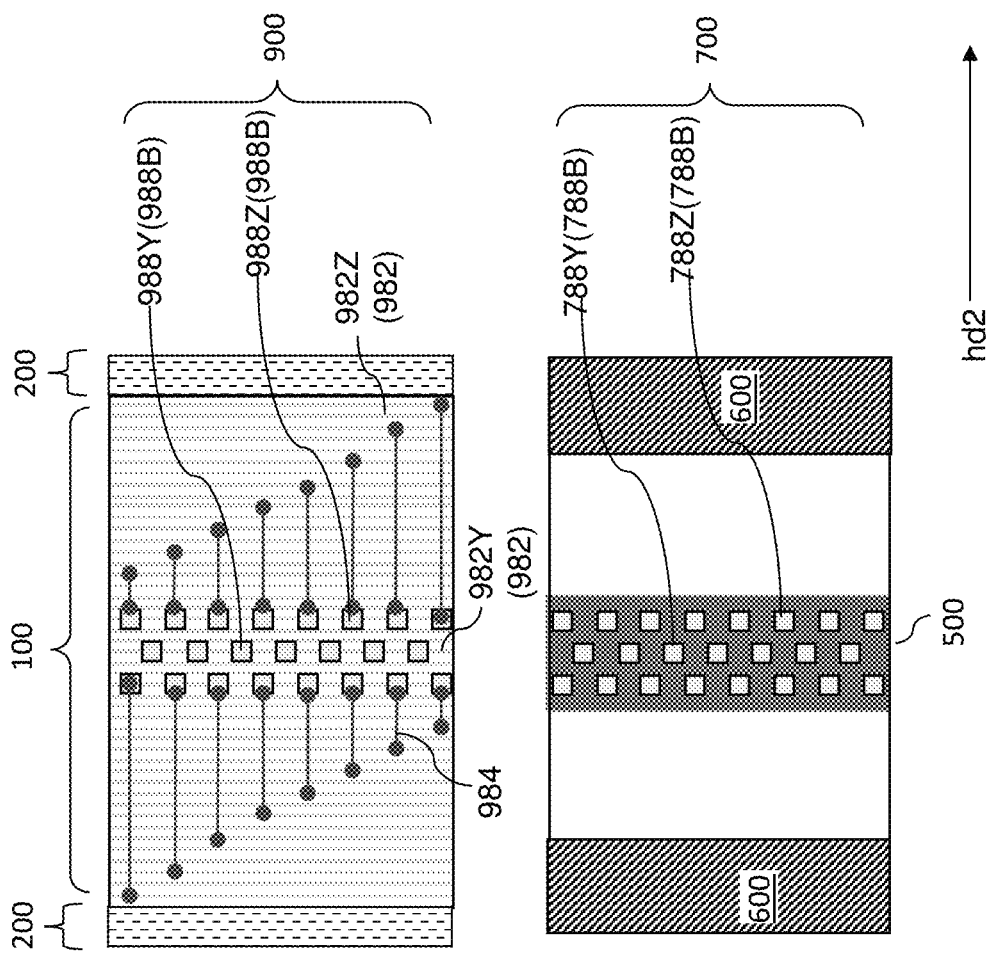

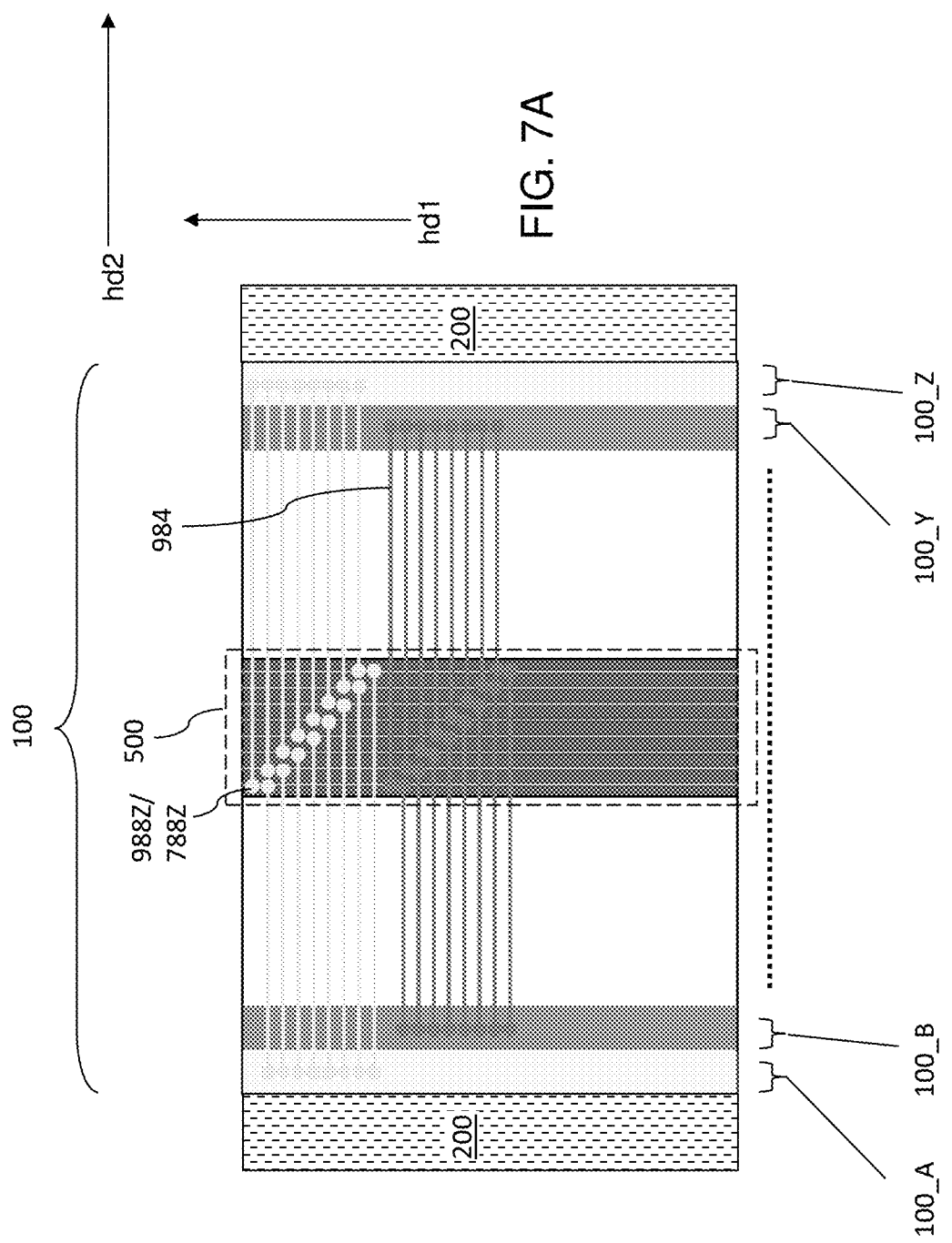

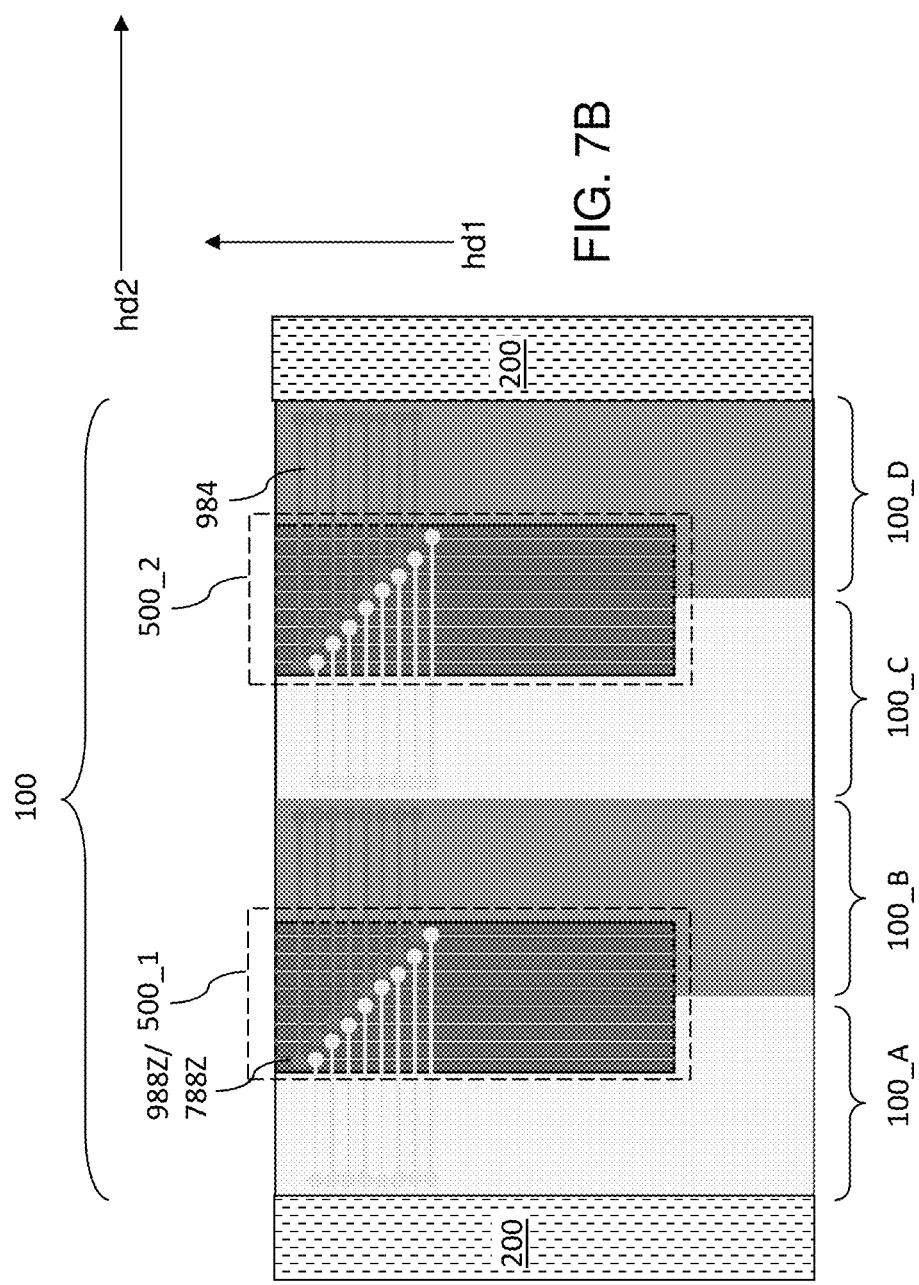

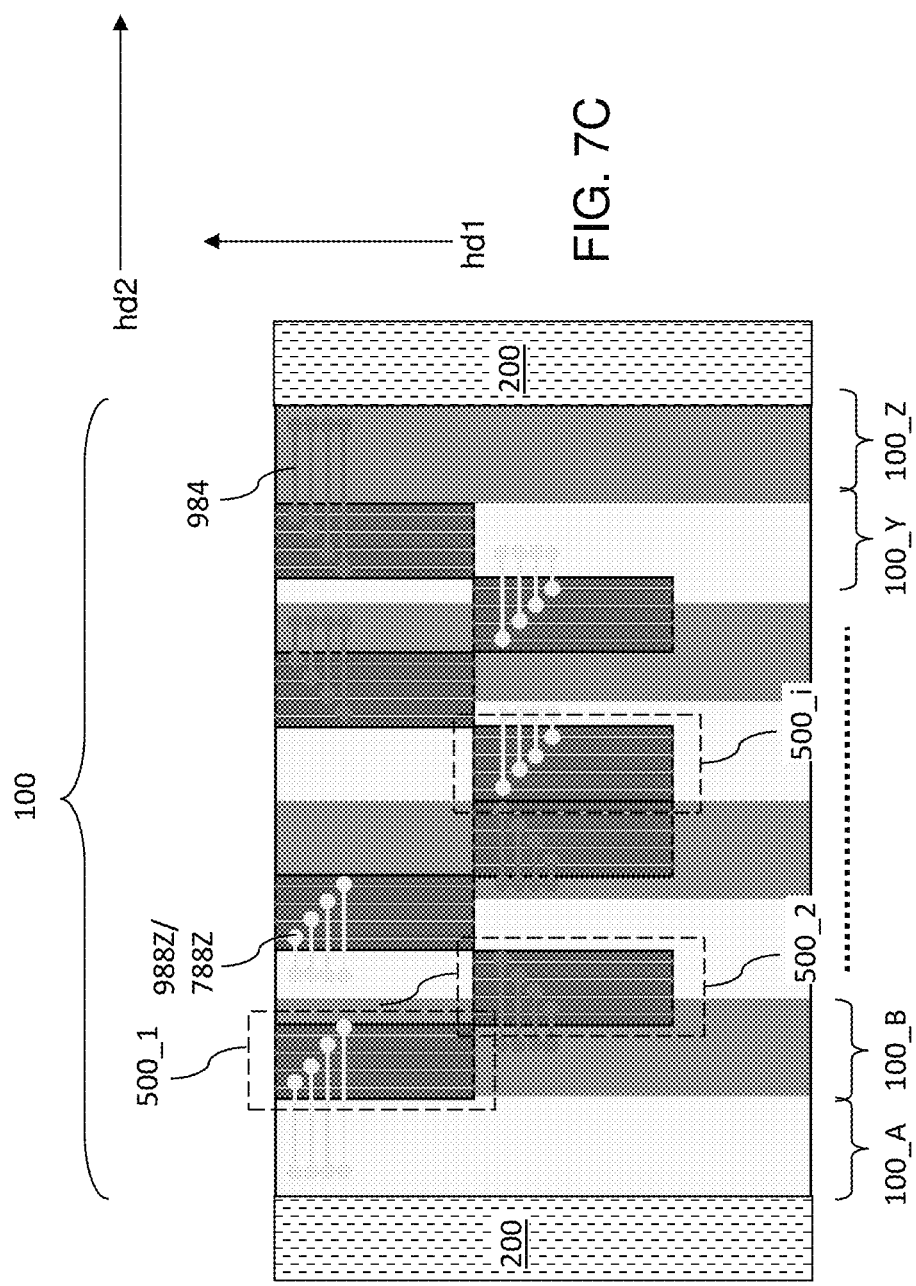

BONDED ASSEMBLY OF A MEMORY DIE AND A LOGIC DIE INCLUDING LATERALLY SHIFTED BIT-LINE BONDING PADS AND METHODS OF FORMING THE SAME

FIELD

The present disclosure relates generally to the field of semiconductor devices, and particularly to a bonded assembly of a memory die and a logic die including bit-line bonding pads that are laterally-shifted from bit lines and methods for forming the same.

BACKGROUND

A bonded assembly of a memory die and a logic die can provide a high-performance three-dimensional memory device. The logic die can include a control circuit for controlling operation of a three-dimensional memory array within the memory die.

SUMMARY

According to an embodiment of the present disclosure, a bonded assembly includes a memory die and a logic die that is bonded to the memory die. The memory die comprises a memory array that includes a memory array region, a plurality of bit lines that are located within the memory array region, and that laterally extend along a first horizontal direction and laterally spaced apart along a second horizontal direction, and memory-side bit-line-connection bonding pads electrically connected to the plurality of bit lines. The logic die comprises sense amplifiers located in sense amplifier region, and logic-side bit-line-connection bonding pads located within the sense amplifier region and bonded to a respective one of the memory-side bit-line-connection bonding pads. The sense amplifier region has an areal overlap with a respective first subset the plurality of bit lines in a plan view, a second subset of the plurality of bit lines does not have an areal overlap with the sense amplifier region in the plan view, each bit line of the first subset that has the areal overlap with the sense amplifier region in the plan view is electrically connected to a respective one of the memory-side bit-line-connection bonding pads via a metal line that does not laterally extend along the second horizontal direction, and each bit line of the second subset that does not have the areal overlap with the sense amplifier region in the plan view is electrically connected to a respective one of the memory-side bit-line-connection bonding pads via a metal line that laterally extends along the second horizontal direction.

According to another aspect of the present disclosure, a method of forming a bonded assembly comprises providing a memory die and a logic die. The memory die comprises a memory array that includes a memory array region, a plurality of bit lines that laterally extend along a first horizontal direction and laterally spaced apart along a second horizontal direction, and are located within the memory array region, and memory-side bit-line-connection bonding pads electrically connected to the plurality of bit lines. The logic die comprises sense amplifiers located entirely within a sense amplifier region, and logic-side bit-line-connection bonding pads located within the sense amplifier region. The method also comprises bonding the logic-side bit-line-connection bonding pads to the memory-side bit-line-connection bonding pads. The sense amplifier region has an areal overlap with a respective first subset the plurality of bit lines in a plan view, a second subset of the plurality of bit lines does not have an areal overlap with the sense amplifier region in the plan view, each bit line of the first subset that has the areal overlap with the sense amplifier region in the plan view is electrically connected to a respective one of the memory-side bit-line-connection bonding pads via a metal line that does not laterally extend along the second horizontal direction, and each bit line of the second subset that does not have the areal overlap with the sense amplifier region in the plan view is electrically connected to a respective one of the memory-side bit-line-connection bonding pads via a metal line that laterally extends along the second horizontal direction.

BRIEF DESCRIPTION OF THE DRAWINGS

FIG. 4A is a schematic vertical cross-sectional view of a portion of the bonded assembly of FIG. 3 that corresponds to the area of a plane within the memory die.

FIG. 4B is a plan view of a portion of the memory die that includes a plane within the bonded assembly of FIG. 4A.

FIG. 4C is a plan view of a portion of the logic die that corresponds to a plane within the bonded assembly of FIG. 4A.

FIG. 5A is a plan view of a portion of the logic die that corresponds to a plane in the bonded assembly of FIGS. 3 and 4A-4C.

FIG. 5B is a plan view of a plane of the memory die in the bonded assembly of FIGS. 3 and 4A-4C.

FIG. 6A is a plan view of a portion of the logic die that corresponds to a plane in the bonded assembly in a second configuration according to a second embodiment of the present disclosure.

FIG. 6B is a plan view of a plane of a memory die in the bonded assembly in the second configuration according to a second embodiment of the present disclosure.

FIGS. 7A-7C are overlapping plan views of a plane of a memory die and a corresponding portion of a logic die in the bonded assembly in alternative configurations according to the second embodiment of the present disclosure.

DETAILED DESCRIPTION

Figure 1A:
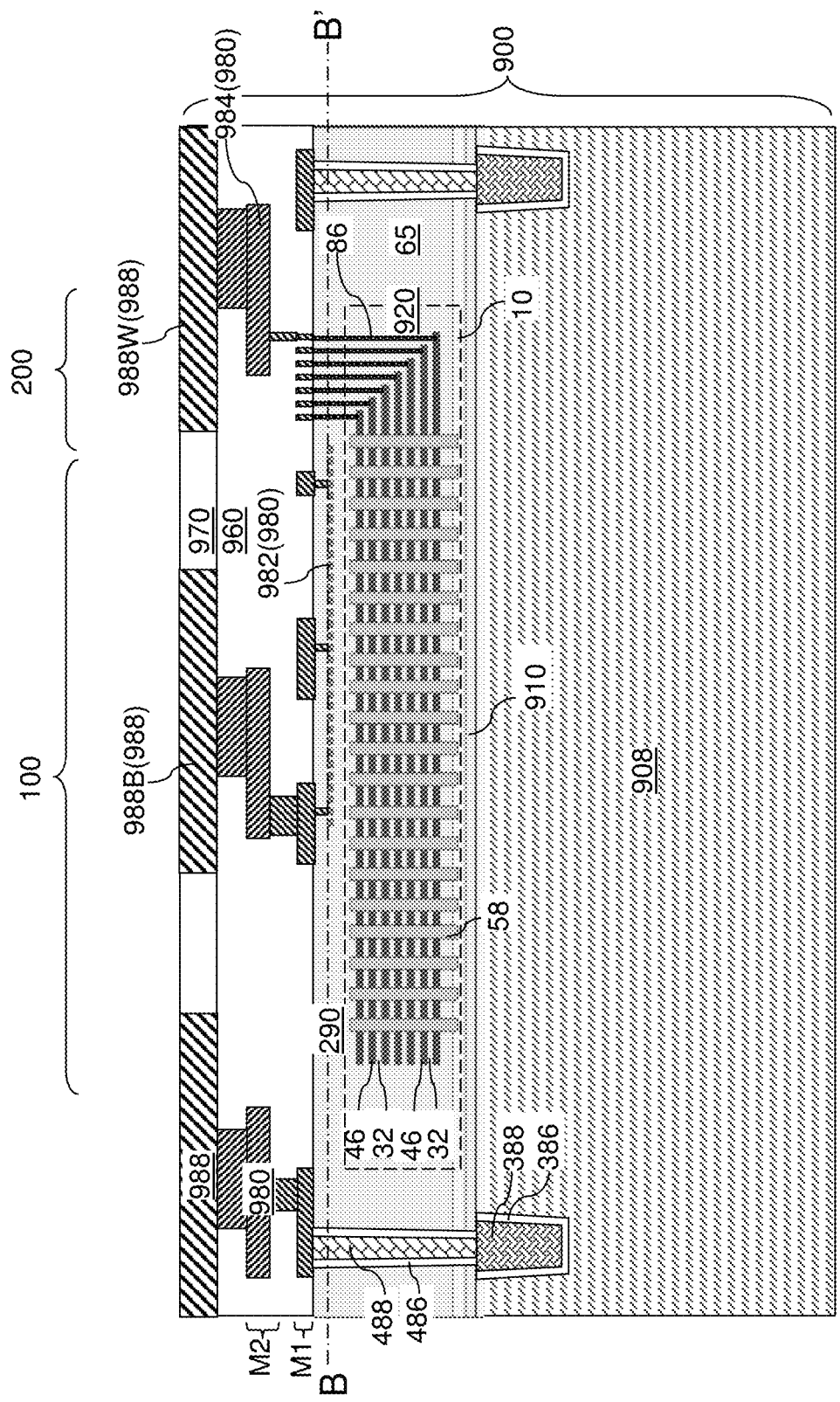
FIG. 1A is a schematic vertical cross-sectional view of a portion of a memory die in a first configuration after formation of a memory-side bonding dielectric layer and memory-side bonding pads according to an embodiment of the present disclosure.
Figure 1B:
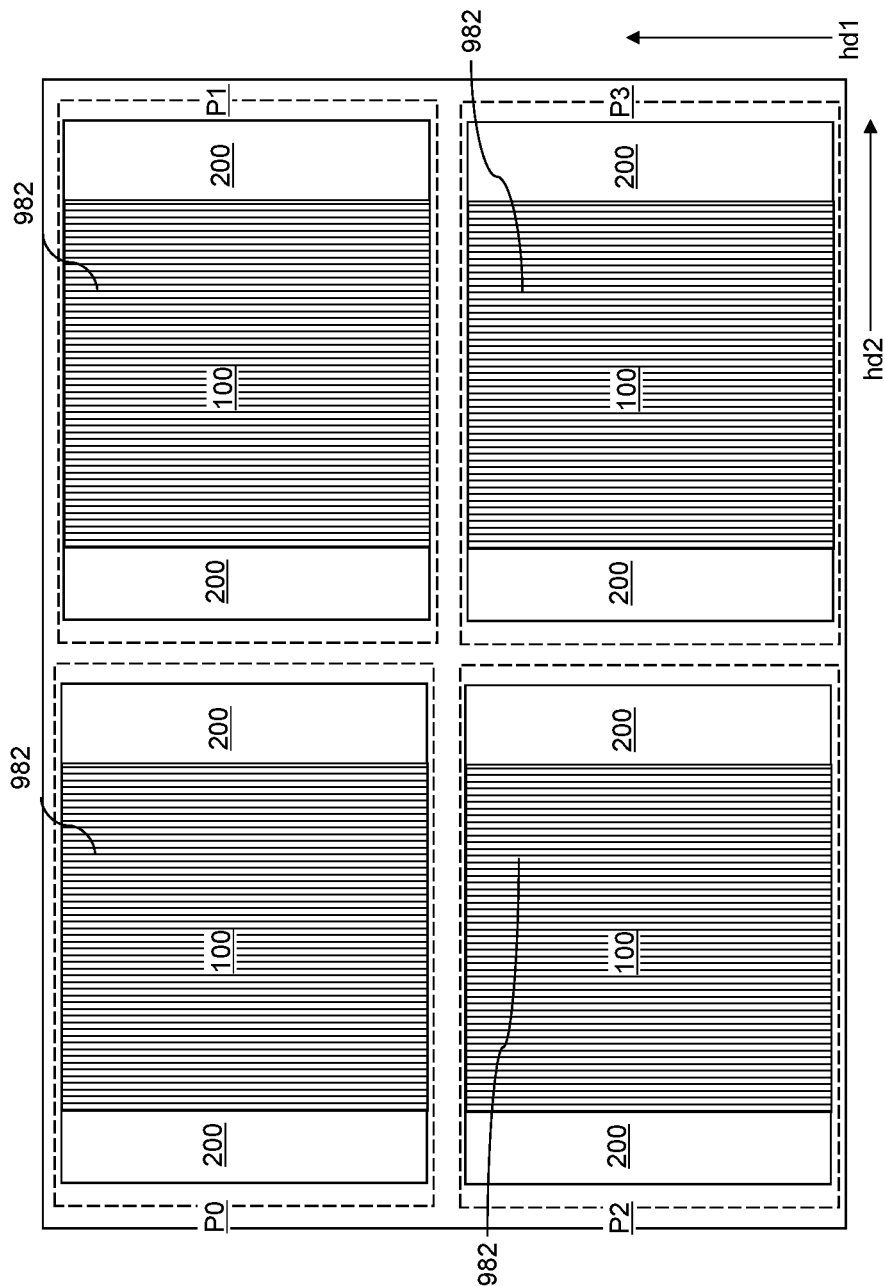
FIG. 1B is a horizontal cross-sectional view of the memory die along the vertical plane B-B' of FIG. 1A.
Figure 1C:
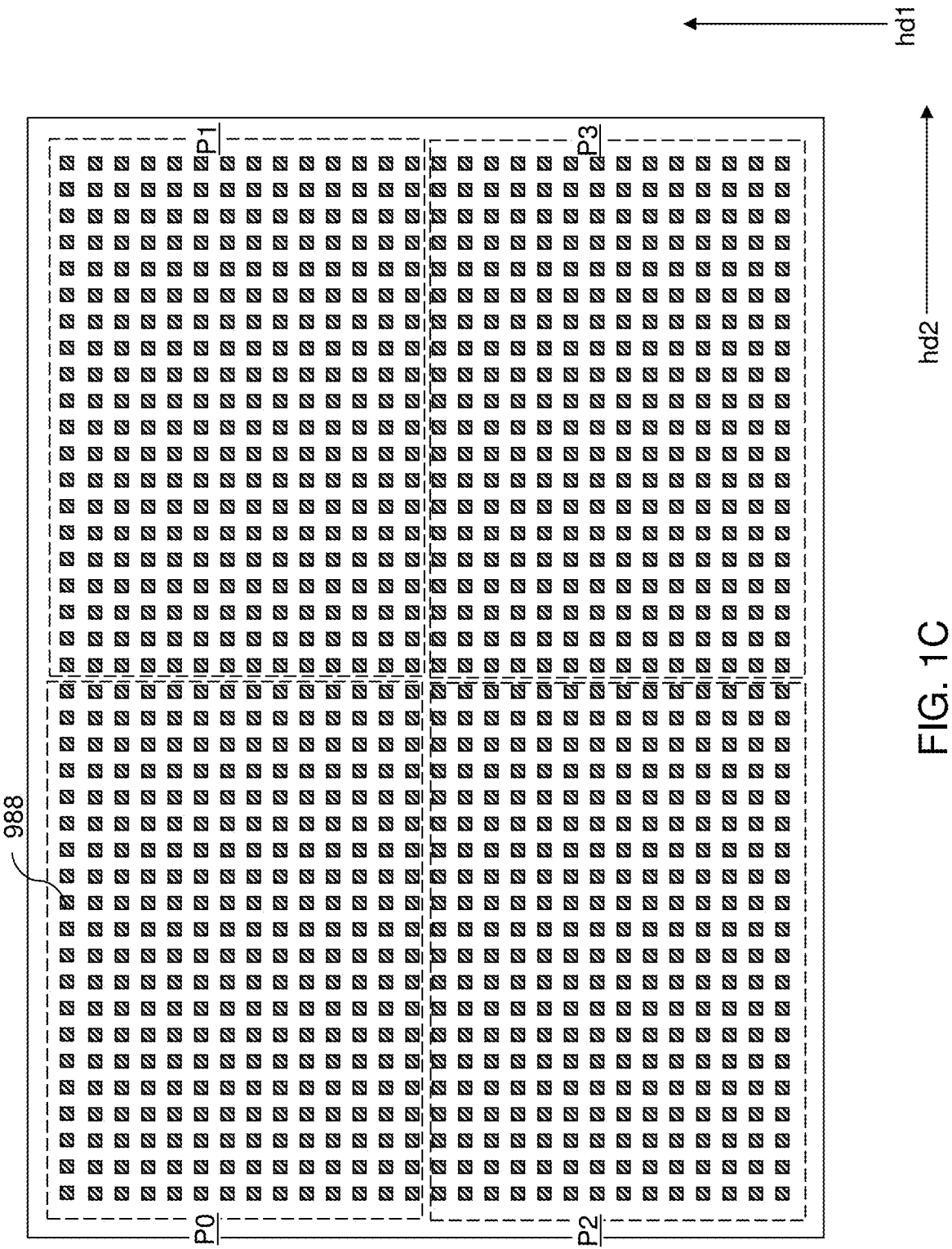
FIG. 1C is a top-down view of the memory die of FIG. 1A.

Embodiments of the present disclosure are directed to a bonded assembly of a memory die and a logic die including bit-line bonding pads that are laterally-shifted from bit lines and methods for forming the same, the various aspects of which are described in detail below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A-1D, a memory die 900 according to an embodiment of the present disclosure is illustrated. The memory die 900 includes a memory-side substrate 908, memory-side semiconductor devices 920 overlying the memory-side substrate 908, memory-side dielectric material layers (290, 960, 970) overlying the memory-side semiconductor devices, and first metal interconnect structures 980 embedded in the memory-side dielectric material layers (290, 960, 970). In one embodiment, the memory-side substrate 908 may be a commercially available silicon wafer having a thickness in a range from 500 microns to 1 mm.

The memory die 900 may include a three-dimensional array of memory elements. In one embodiment shown in FIG. 1B, the memory die 900 can include multiple planes (P0, P1, P2, P3), each of which may include a memory array region 100 and at least one staircase region 200. Generally, the memory die 900 may include a single plane P0 or multiple planes (P0, P1, P2, P3). The total number of planes (P0, P1, P2, P3) in the memory die 900 may be selected based on performance requirements on the memory die 900. In one embodiment, each plane (P0, P1, P2, P3) may include a respective memory array region 100 and a respective pair of staircase regions 200 that laterally extend along a first horizontal direction (e.g., bit line direction) hd1 and laterally spaced apart from each other along a second horizontal direction (e.g., word line direction) hd2.

Optionally, discrete substrate recess cavities can be formed in an upper portion of the memory-side substrate 908 by applying a photoresist layer over the top surface of the memory-side substrate 908, lithographically patterning the photoresist layer to form an array of discrete openings, and transferring the pattern of the array of discrete openings into the upper portion of the memory-side substrate by performing an anisotropic etch process. The photoresist layer can be subsequently removed, for example, by ashing. The depth of each discrete substrate recess cavity can be in a range from 500 nm to 10,000, although lesser and greater depths can also be employed. As shown in FIG. 1A, an optional dielectric through-substrate liner 386 (e.g., silicon oxide liner) and an optional electrically conductive through-substrate via structure 388 (e.g., tungsten via structure) can be formed within each discrete substrate recess cavity.

Generally, the memory-side semiconductor devices 920 may comprise any semiconductor device known in the art. In one embodiment, the memory die 900 may include a three-dimensional NAND memory device. In an illustrative example, the memory-side semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

Figure 1D:
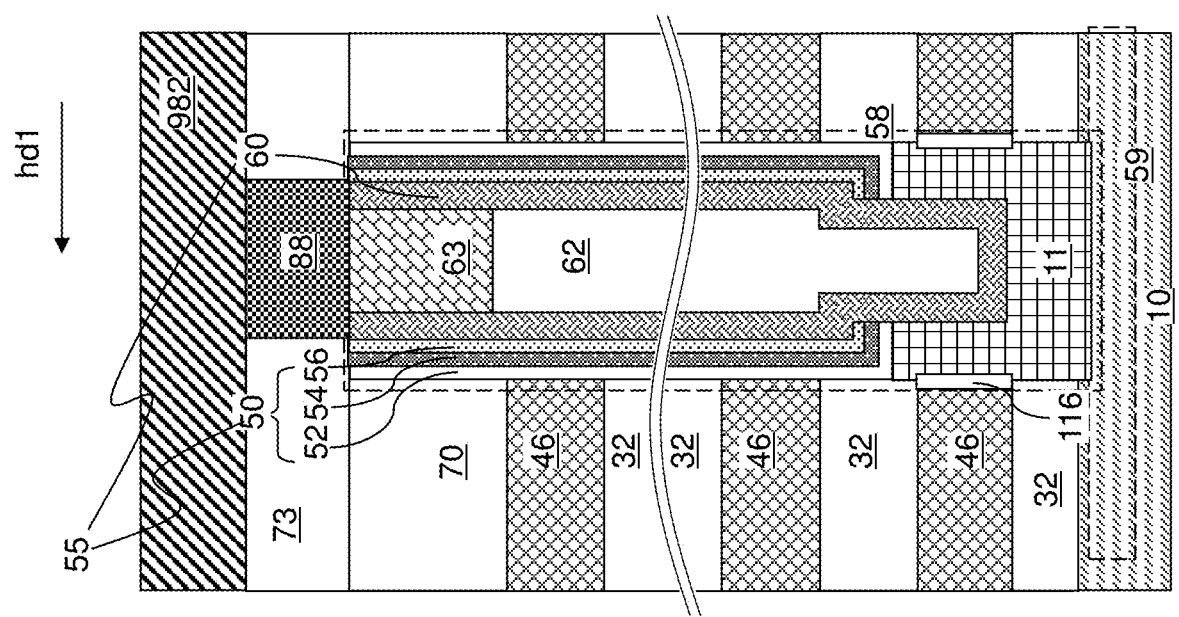
FIG. 1D is a magnified view of a memory opening fill structure within the memory die of FIGS. 1A-1C.

A memory opening fill structure 58 may be formed within each memory opening in a memory array region 100. As shown in FIG. 1D, each memory opening fill structure 58 may include a memory film 50 and a vertical semiconductor channel 60 contacting the memory film. A drain region 63 is located on a top part of the vertical semiconductor channel 60. An optional dielectric fill region 62 may be located below the drain region 63 and surrounded by the vertical semiconductor channel 60. The memory film 50 may include a blocking dielectric layer 52, a dielectric liner 56 (which may be a tunneling dielectric layer) and a memory material layer 54 located between the blocking dielectric layer 52 and the dielectric liner 56. The memory material layer 54 may comprise a charge trapping layer, such as a silicon nitride layer, or a plurality of discrete charge trapping regions, such as floating gates or discrete portions of a charge trapping layer. Alternatively, the memory material layer 54 may include a ferroelectric material. The portions of the memory material layer 54 adjacent to the electrically conductive layers 46 (i.e., word lines/control gate electrodes) comprise memory elements (e.g., memory cells). In this case, each memory opening fill structure 58 and adjacent portions of the electrically conductive layers 46 constitute a vertical NAND string. Optionally, the memory opening fill structure 58 may include a pedestal channel portion 11, and a dielectric insulating spacer 116 laterally surrounding the pedestal channel portion 11 and providing electrical isolation for the pedestal channel portion 11 from an adjacent electrically conductive layer 46. An insulating cap layer 70 may overlie each vertically alternating stack (32, 36). A contact-level dielectric layer 73 may be provided over the insulating cap layer 70, and drain contact via structures 88 contacting a top surface of a respective drain region 63 can be provided within the contact-level dielectric layer 73. Bit lines 982 laterally extending along the first horizontal direction hd1 may be provided over the contact-level dielectric layer 73. The memory device may include an optional horizontal semiconductor channel layer 10 connected to the bottom end of each vertical semiconductor channel, and an optional dielectric spacer layer 910 that provides electrical isolation between the memory-side substrate 908 and the horizontal semiconductor channel layer 10. An upper portion of the horizontal semiconductor channel layer 10 may include a horizontal semiconductor channel 59.

The electrically conductive layers 46 may be patterned to provide a staircase region (i.e., a terrace region) 200 in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

Through-memory-level via cavities can be formed through the dielectric material portions 65, the optional dielectric spacer layer 910, and the horizontal semiconductor channel layer 10. An optional through-memory-level dielectric liner 486 and a through-memory-level via structure 488 can be formed within each through-memory-level via cavity. Each through-memory-level dielectric liner 486 includes a dielectric material such as silicon oxide. Each through-memory-level via structure 488 includes any suitable electrically conductive material (e.g., tungsten, copper, titanium nitride, etc.) can be formed directly on a respective one of the through-substrate via structure 388.

The memory-side dielectric material layers (290, 960, 970) are also referred to as memory-side dielectric material layers. The memory-side dielectric material layers (290, 960, 970) may include first contact-level dielectric layers 290 embedding contact via structures and bit lines 982, memory-side interconnect-level dielectric layers 960 that embed a subset of the first metal interconnect structures 980 located above the first contact-level dielectric layers 290, and a memory-side bonding dielectric layer 970 that is formed above the memory-side interconnect-level dielectric layers 960. The first metal interconnect structures 980 are also referred to as memory-side dielectric material layers. The bit lines 982 are a subset of the first metal interconnect structures 980 and may electrically contact drain regions 63 located above the semiconductor channels 60 at the top of the memory opening fill structures 58. The contact via structures contact various nodes of the memory-side semiconductor devices or the through-memory-level via structure 488. Interconnect metal lines and interconnect metal via structures, (which are subsets of the first metal interconnect structures 980) may be embedded in the memory-side interconnect-level dielectric layers 960. Thus, the first metal interconnect structures 980 can be located within the memory-side interconnect-level dielectric layers 960. In an illustrative example, the first metal interconnect structures 980 may include a first memory-side metal level M0 including memory-side first-level metal lines (including bit lines 982 and other first-level metal lines), and a second memory-side metal level M1 including memory-side second-level metal lines.

According to an aspect of the present disclosure, the bit lines 982 laterally extend along the first horizontal direction hd1 within each of the planes (P0, P1, P2, P3). Each bit line 982 can be electrically connected to a respective subset of the drain regions 63. In one embodiment, the entirety of each memory array region 100 may be filled with at least one array of memory opening fill structures 58. According, the bit lines 982 may cover the entire area of the memory array regions 100.

Each of the first contact-level dielectric layers 290 and the memory-side interconnect-level dielectric layers 960 may include a dielectric material such as undoped silicate glass, a doped silicate glass, organosilicate glass, silicon nitride, a dielectric metal oxide, or a combination thereof. The memory-side bonding dielectric layer 970 may include, and/or consist essentially of, a silicon oxide material such as undoped silicate glass (e.g., silicon oxide) or a doped silicate glass. The thickness of the memory-side bonding dielectric layer 970 may be in a range from 100 nm to 3,000 nm, although lesser and greater thicknesses may also be employed. The memory-side bonding dielectric layer 970 may have a planar top surface, which may be provided, for example, by a planarization process such as a chemical mechanical polishing (CMP) process. A topmost layer of the memory-side interconnect-level dielectric layers 960 may be a dielectric diffusion barrier layer (not expressly shown), which may be a silicon nitride layer having a thickness in a range from 10 nm to 300 nm.

Memory-side bonding pads 988 are formed in the memory-side bonding dielectric layer 970, for example, by forming pad cavities in the memory-side bonding dielectric layer 970 and filling the pad cavities with at least one conductive material. Alternatively, the memory-side bonding pads 988 are formed on the first metal interconnect structures 980 first, followed by forming the memory-side bonding dielectric layer 970 over and around the memory-side bonding pads 988, followed by planarizing the memory-side bonding dielectric layer 970 to expose the top surface of the memory-side bonding pads 988. The at least one conductive material may be a metallic (i.e., metal or metal alloy) material that may be bonded to the same metallic material or to another metallic material by metal-to-metal or hybrid bonding. For example, each of the memory-side bonding pads 988 may include an optional metallic liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%), or a cobalt or nickel alloy, such as CoW, CoWP, CoMoP, NiW, and/or NiWP. In one embodiment, the memory-side bonding pads 988 may be arranged as a periodic two-dimensional array.

Each of the memory-side bonding pads 988 is surrounded by the memory-side bonding dielectric layer 970 and contacts a respective underlying one of the first metal interconnect structures 980. Each of the memory-side bonding pads 988 is electrically connected to a respective node of the memory-side semiconductor devices 920. The electrically conductive layers 46 comprise word lines for the memory elements (e.g., memory cells) located within the memory opening fill structures 58. Each of the electrically conductive layers 46 can be electrically connected to a respective subset of the memory-side metal interconnect structures 980 through a respective word-line-contact via structures 86 located within a staircase region 200. The lateral extent of the electrically conductive layers 46 along the second horizontal direction hd2 decreases with a vertical distance from the substrate to enable electrical contact between each of the electrically conductive layers 46 and a respective one of the word-line-contact via structures 86.

According to an aspect of the present disclosure, the memory-side bonding pads 988 comprise memory-side bit-line-connection bonding pads 988B that are electrically connected to the plurality of bit lines 982 of the memory die 900. Further, the memory-side bonding pads 988 comprise memory-side word-line-connection bonding pads 988W that are electrically connected to the word-line-contact via structures 86.

According to an aspect of the present disclosure, the memory-side bit-line-connection bonding pads 988B comprise first memory-side bit-line-connection bonding pads electrically connected to, and having an areal overlap with, a respective bit line 982 to which it is electrically connected within a first subset of the plurality of bit lines in the plan view (i.e., in a view along the vertical direction in which layout of components of the memory die 900 is shown), and second memory-side bit-line-connection bonding pads electrically connected to, not having any areal overlap in the plan view with, and laterally shifted along the second horizontal direction from, a respective bit line within a second subset of the bit lines 982. Details of this layout feature are subsequently described with reference to a bonded assembly including the memory die 900 and a logic die.

In one embodiment, metal lines laterally extending along the second horizontal direction hd2 (i.e., word line direction perpendicular to the lengthwise direction of the bit lines 982) can electrically connect a respective pair of a bit line 982 within the second subset of the bit lines 982 and a respective one of the second memory-side bit-line-connection bonding pads. Such metal lines are components of the memory-side metal interconnect structures 980, and can be located between the level of the bit lines 982 and the level of the memory-side bonding pads 988.

The memory die 900 can comprise a three-dimensional array of memory elements located within a memory array region 100. The memory elements (e.g., portions of the memory material layers 54 in a memory film 50) can be arranged around a two-dimensional array of vertical semiconductor channels 60, and bit lines 982 can be electrically connected to drain regions 63 at top end portions of a respective subset of the vertical semiconductor channels 60. The memory die 900 can optionally comprise through-substrate via structures 388 electrically connected to a subset of memory-side bonding pads 988 (i.e., memory-side bonding pads) located along a front-side edge of the memory die 900.

Generally, the memory die 900 includes: a three-dimensional memory array that includes an alternating stack of insulating layers 32 and electrically conductive layers 46 located on a memory-side substrate (such as the memory-side substrate 908) and includes memory stack structures 55 vertically extending through the alternating stack (32, 46) in a memory array region 100 in which each layer within the alternating stack (32, 46) is present, a plurality of bit lines 982 that laterally extend along a first horizontal direction hd1 and laterally spaced apart along a second horizontal direction hd2, are located within the memory array region 100, and are configured to electrically access a respective set of memory elements (such as portions of vertical semiconductor channels 60 via the drain regions 63 and contact via structures 88) within the memory stack structures 55, and memory-side bit-line-connection bonding pads electrically connected to the plurality of bit lines 982.

Figure 2A:
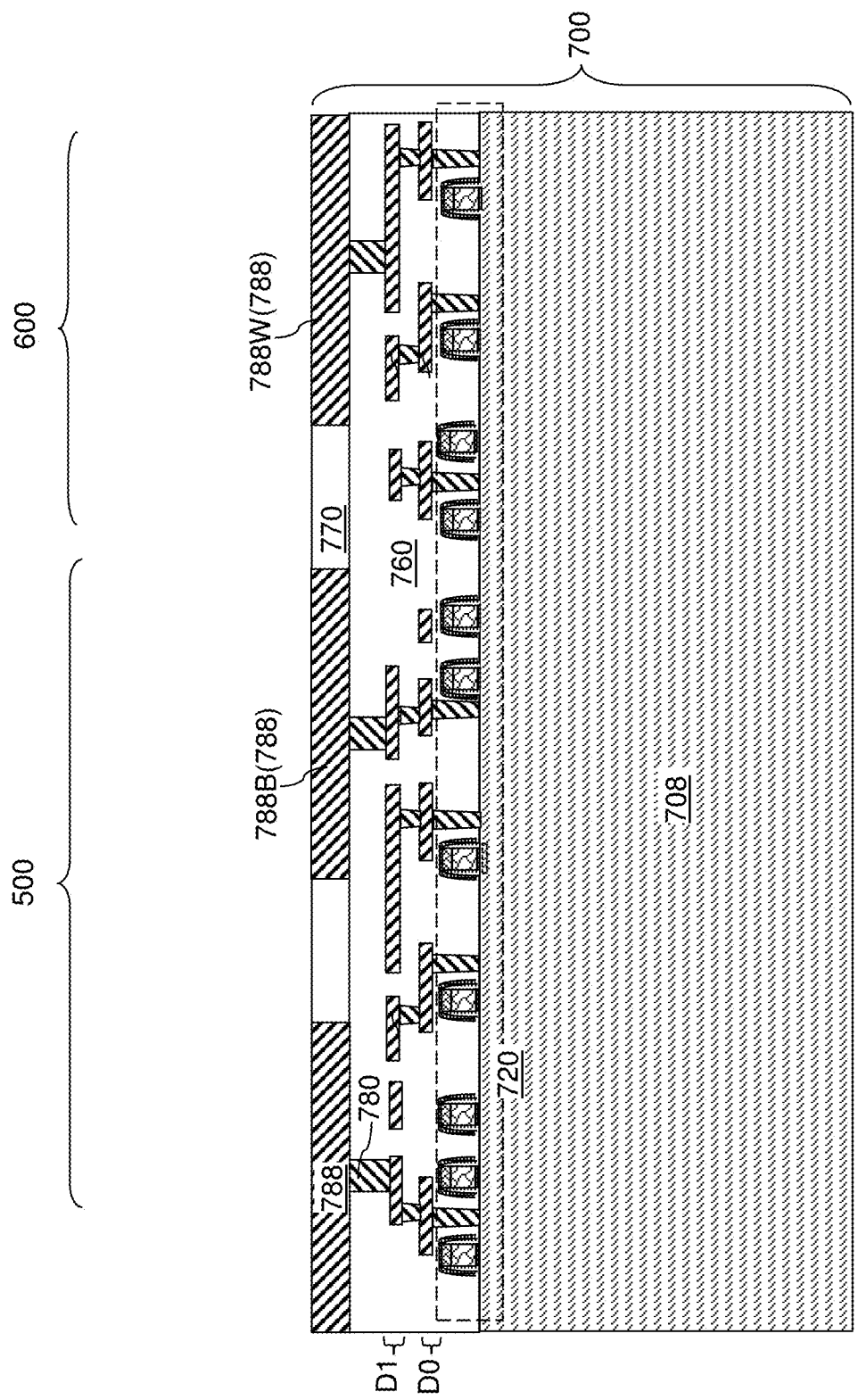
FIG. 2A is a schematic vertical cross-sectional view of a region of a logic die after formation of a logic-side bonding dielectric layer and logic-side bonding pads according to an embodiment of the present disclosure.
Figure 2B:
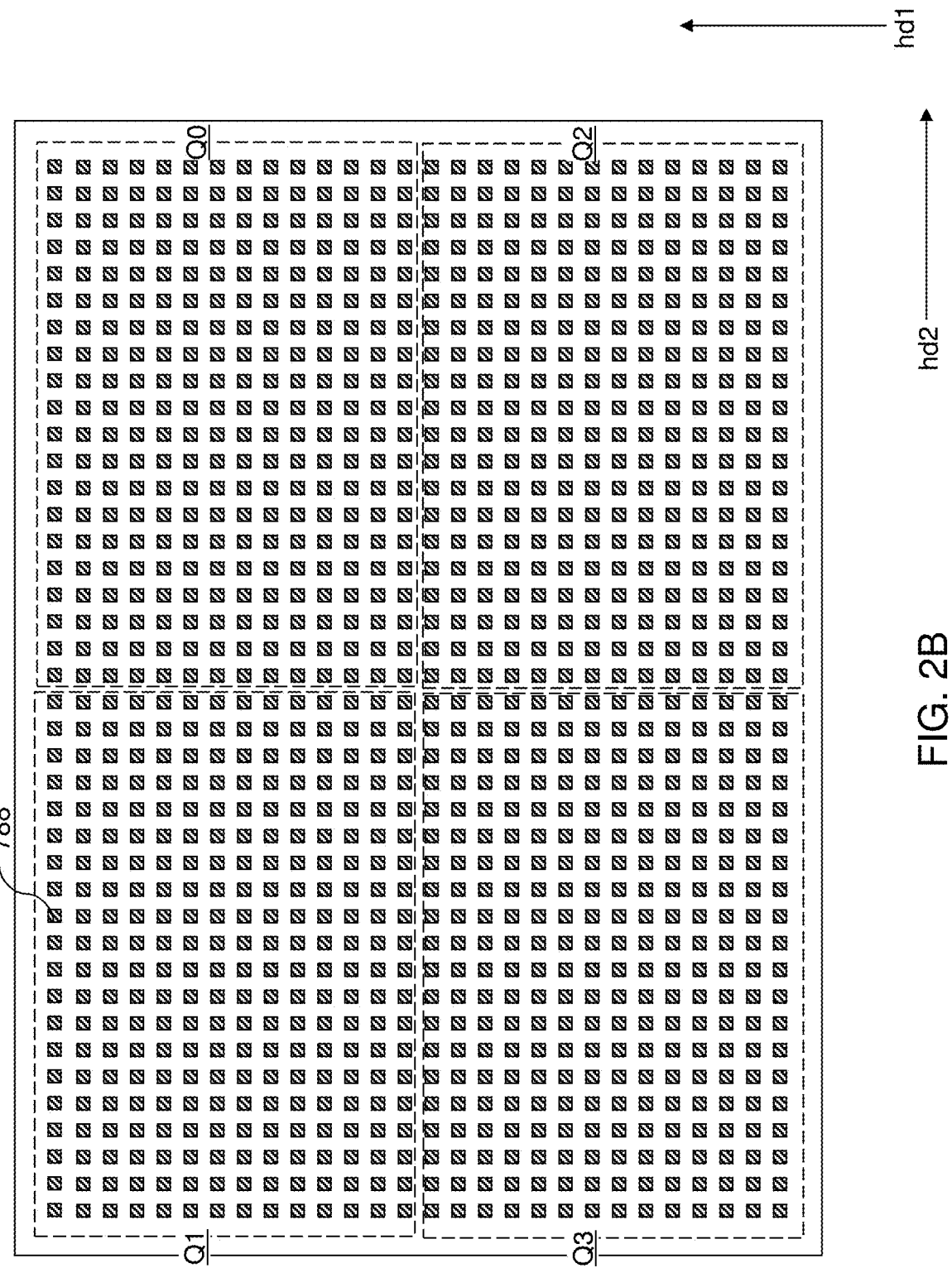
FIG. 2B is a top-down view of the logic die of FIG. 2A.

Referring to FIGS. 2A and 2B, a logic die 700 is provided. The logic die 700 includes a logic-side substrate 708, logic-side semiconductor devices 720 overlying the logic-side substrate 708, logic-side dielectric material layers (760, 770) overlying the logic-side semiconductor devices 720, and logic-side metal interconnect structures 780 embedded in the logic-side dielectric material layers (760, 770). The logic die 700 may include the same number of plane driver circuits (Q0, Q1, Q2, Q3) as the number of the planes (P0, P1, P2, P3) within the memory die 900. The size of each plane driver circuit (Q0, Q1, Q2, Q3) in the logic die 700 may be the same as or different from the size of a respective plane (P0, P1, P2, P3) in the memory die 900.

In one embodiment, the logic-side semiconductor devices 720 may include field effect transistors in a complementary metal oxide semiconductor (CMOS) configuration. In one embodiment, the logic-side substrate 708 may be a commercially available silicon substrate having a thickness in a range from 500 microns to 1 mm.

Generally, the logic-side semiconductor devices 720 may comprise any semiconductor devices that may be operated in conjunction with the memory-side semiconductor devices in the memory die 900 to provide enhanced functionality. In one embodiment, the memory die 900 comprises a memory die and the logic die 700 comprises a logic die that includes a support circuitry (i.e., control circuitry, e.g., peripheral circuitry) for operation of memory devices (such as a three-dimensional array of memory elements) within the memory die. In one embodiment, the memory die 900 may include a three-dimensional memory device including a three-dimensional array of memory elements, word lines (that may comprise a subset of the electrically conductive lines 46), and bit lines 982, the logic-side semiconductor devices 720 of the logic die 700 may include a peripheral circuitry for operation of the three-dimensional array of memory elements. The peripheral circuitry may include one or more word line driver circuits that drive the word lines of the three-dimensional array of memory elements of the memory die 900, one or more bit line driver circuits that drive the bit lines 982 of the memory die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the memory die 900, a source power supply circuit that provides power to the horizontal semiconductor channel layer 10 in the memory die 900, a data buffer and/or latch, and/or any other semiconductor circuit that may be used to operate three-dimensional memory device of the memory die 900.

The logic-side dielectric material layers (760, 770) can include logic-side interconnect-level dielectric layers 760 embedding the logic-side metal interconnect structures 780, and a logic-side bonding dielectric layer 770 that is formed above the logic-side interconnect-level dielectric layers 760. The logic-side interconnect-level dielectric layers 760 may include a dielectric material such as undoped silicate glass (e.g., silicon oxide), a doped silicate glass, organosilicate glass, silicon nitride, a dielectric metal oxide, or a combination thereof. In an illustrative example, the logic-side metal interconnect structures 780 may include a first logic-side metal level D0 including logic-side first-level metal lines, a second logic-side metal level D1 including logic-side second-level metal lines, and third logic-side metal level D2 including logic-side third-level metal lines. Level D0 may be used for local routing/interconnects, level D1 may be used for bus routing/interconnects, and level D2 may be used for global routing/interconnects The logic-side bonding dielectric layer 770 may include undoped silicate glass or a doped silicate glass (e.g., a doped or undoped silicon oxide material). The thickness of the logic-side bonding dielectric layer 770 may be in a range from 100 nm to 3,000 nm, although lesser and greater thicknesses may also be employed. The logic-side bonding dielectric layer 770 may have a planar top surface, which may be provided, for example, by a planarization process such as a chemical mechanical polishing (CMP) process.

Logic-side bonding pads 788 are formed in the logic-side bonding dielectric layer 770, for example, by forming pad cavities in the logic-side bonding dielectric layer 770 and filling the pad cavities with at least one conductive material. Alternatively, the bonding pads 788 are formed on the logic-side metal interconnect structures 780 first, followed by forming the logic-side bonding dielectric layer 770 over and around the logic-side bonding pads 788, followed by planarizing the logic-side bonding dielectric layer 770 to expose the top surface of the logic-side bonding pads 788. The at least one conductive material may be a metallic (i.e., metal or metal alloy) material that may be bonded to the same metallic material or to another metallic material by metal-to-metal or hybrid bonding. For example, each of the memory-side bonding pads 988 may include an optional metallic liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%), or a cobalt or nickel alloy, such as CoW, CoWP, CoMoP, NiW, and/or NiWP. The material of the logic-side bonding pads 788 may be the same as, or may be different from, the material of the memory-side bonding pads 988.

Each of the logic-side bonding pads 788 is embedded in the logic-side bonding dielectric layer 770 and contacts a respective underlying one of the logic-side metal interconnect structures 780. Each of the logic-side bonding pads 788 is electrically connected to a respective node of the logic-side semiconductor devices 720. In case the logic die 700 comprises a logic die, the logic-side bonding pads 788 are also referred to logic-side bonding pads. The logic-side bonding pads 788 can be arranged in the pattern of the mirror image of the memory-side bonding pads 988.

The types of devices of the memory die 900 and of the logic die 700 may be selected in any manner such that the devices 920 of the memory die 900, and the logic-side semiconductor devices 720 of the logic die 700 may communicate with each other, and control, and or are controlled by, devices in the other semiconductor die. In one embodiment, one of the memory die 900 and the logic die 700 comprises a memory die including memory elements, such as a three-dimensional array of memory elements, and another of the memory die 900 and the logic die 700 comprises a logic die including peripheral circuitry configured to operate the memory elements, such as the three-dimensional array of memory elements.

Generally, the logic die 700 comprise a control (i.e., driver) circuit configured to control operation of the three-dimensional array of memory elements of the memory die 900. The control circuit comprises sense amplifiers located entirely within a respective sense amplifier region, a word line driver region, logic-side bit-line-connection bonding pads 788B configured to be bonded to memory-side bit-line-connection bonding pads 988B in the memory die 900, and logic-side word-line-connection bonding pads 788W configured to be bonded to memory-side word-line-connection bonding pads 988W in the memory die 900. In one embodiment, the logic-side bit-line-connection bonding pads 988B can be located entirely within the sense amplifier region.

In one embodiment, sense amplifiers in each plane driver circuit (Q0, Q1, Q2, Q3) can be located in a sense amplifier region a respective plane driver circuit (Q0, Q1, Q2, Q3) that is located entirely within, and has a lesser lateral extent along the second horizontal direction hd2 than, an area of the memory array region 100 of a respective plane (P0, P1, P2, P3) of the memory die 900 in a plan view along a vertical direction.

Referring to FIGS. 3, 4A-4C, 5A, and 5B, the memory die 900 and the logic die 700 are oriented such that the memory-side bonding dielectric layer 970 faces the logic-side bonding dielectric layer 770. The logic die 700 and the memory die 900 are brought into contact such that a surface of the logic-side bonding dielectric layer 770 contacts a surface of the memory-side bonding dielectric layer 970, and each surface of the logic-side bonding pads 788 contacts a surface of a respective one of the memory-side bonding pads 988. In one embodiment, the pattern of the logic-side bonding pads 788 may be a mirror image of the pattern of the memory-side bonding pads 988 with optional differences in the size of bonding pads between the memory die 900 and the logic die 700. In one embodiment, the memory-side bonding pads 988 and the corresponding logic-side bonding pads 788 may have the same size (i.e., lateral width). In another embodiment, the memory-side bonding pads 988 and the corresponding logic-side bonding pads 788 may have different sizes. In one embodiment, areal overlap between each facing pair of a memory-side bonding pad 988 and a logic-side bonding pad 788 may be at least 80%, and/or at least 90%, such as 90 to 100%, of the area of the smaller one of the memory-side bonding pad 988 and the logic-side bonding pad 788.

The logic-side bonding pads 788 may be bonded to the memory-side bonding pads 988 by performing an anneal process that induces metal-to-metal bonding between the logic-side bonding pads 788 and the memory-side bonding pads 988 and optionally dielectric bonding between the memory-side bonding dielectric layer 970 and the logic-side bonding dielectric layer 770. The anneal temperature may be selected based on the composition of the logic-side bonding pads 788 and the memory-side bonding pads 988. For example, if the logic-side bonding pads 788 and the memory-side bonding pads 988 include metal fill portions that consist essentially of copper, the anneal temperature may be in a range from 250 degrees Celsius to 400 degrees Celsius. The through-substrate via structures 388 in the memory die 900 can be electrically connected to a subset of memory-side bonding pads 988 located along a front-side edge of the memory die 900. A bonded assembly of the memory die 900 and the logic die 700 is provided.

Generally, the logic-side bit-line-connection bonding pads 788B are bonded to the memory-side bit-line-connection bonding pads 988B. The sense amplifier region 500 can be located entirely within, and can have a lesser lateral extent along the second horizontal direction hd2 than an area of the memory array region 100 in a plan view along a vertical direction. In one embodiment, the logic-side bit-line-connection bonding pads 788B can be located entirely within the sense amplifier region 500, and can be bonded to a respective one of the memory-side bit-line-connection bonding pads 988B. Word line driver regions 600 in the logic die 700 include word line drivers (e.g., word line switching transistors) for driving the word lines in the memory die 900, which are the electrically conductive layers 46 within the alternating stack (32, 46).

Referring collectively to FIGS. 1A-1D, 2A, 2B, 3, 4A-4C, 5A, and 5B, the memory die 900 can comprise memory array that includes a memory array region 100; a plurality of bit lines 982 that laterally extend along a first horizontal direction hd1 and laterally spaced apart along a second horizontal direction hd2, are located within the memory array region 100; and memory-side bit-line-connection bonding pads 988B electrically connected to the plurality of bit lines 982. The logic die 700 comprises sense amplifiers located in a sense amplifier region 500 that is located entirely within and has a lesser lateral extent along the second horizontal direction hd2 than an area of the memory array region 100 in a plan view along a vertical direction, and logic-side bit-line-connection bonding pads 788B located within the sense amplifier region 500 and bonded to a respective one of the memory-side bit-line-connection bonding pads 988B.

In one embodiment, the memory array comprises a three-dimensional memory array that includes an alternating stack of insulating layers 32 and electrically conductive layers 46 located on a memory-side substrate 908 and includes memory stack structures 55 vertically extending through the alternating stack (32, 46) in a memory array region 100 in which each layer within the alternating stack (32, 46) is present. However, in an alternative embodiment, the memory array may comprise any suitable two-dimensional memory array that contains memory cells, word lines and bit lines in the memory array region.

According to an aspect of the present disclosure shown in FIGS. 4A-4C, providing a sense amplifier region 500 having a lesser (i.e., smaller) dimension along the second horizontal direction (e.g., word line direction) hd2 than the memory array region 100 of the memory die 900 allows allocation of a greater area of the word line driver regions 600. This allows the size of the memory die 900 and the logic die 700 to be reduced in the second horizontal direction hd2. Specifically, the width of each staircase region 200 along the second horizontal direction hd2 can be less than the width of a word line driver region 600 along the second horizontal direction hd2 in the logic die 700. According to an aspect of the present disclosure, the device area for the word line driver region 600 is greater than the device area for the staircase regions 200. Reducing the lateral dimension of the sense amplifier region 500 along the second horizontal direction hd2 relative to the lateral dimension of the memory array region 100 along the second horizontal direction hd2 enables use of a lesser area for each of the staircase regions 200, and thus, enables use of a higher percentage of the area of the memory die 900 for the memory array region(s) 100.

Generally, the alternating stack (32, 46) comprises a staircase region 200 in which lateral extent of the electrically conductive layers 46 along the second horizontal direction hd2 increase with a vertical distance from the logic die 700. In one embodiment, word-line-contact via structures 86 contact a respective one of the electrically conductive layers 46 in the staircase region 200 and extends toward the logic die 700. The logic die 700 comprises a word line driver circuit located within a word line driver region 600 that overlaps an entire area of the staircase region 200 and has a greater lateral dimension along the second horizontal direction hd2 than the staircase region 200 in the plan view. In one embodiment, the word line driver region 600 has an areal overlap with the memory array region 100 in the plan view.

In one embodiment, the memory die 900 comprises memory-side word-line-connection bonding pads 988W that are electrically connected to the word-line-contact via structures 86, and the logic die 700 comprises logic-side word-line-connection bonding pads 788W that are bonded to the memory-side word-line-connection bonding pads 988W and electrically connected to output nodes of the word line driver circuit via logic-side metal interconnect structures 780. In one embodiment, the word line driver region 600 that has a partial overlap with the memory array region 100 in the plan view. In other words, the area of the word line driver region 600 overlaps with a fraction of the area of the memory array region 100.

In one embodiment, the sense amplifier region 500 borders the word line driver region 600 in the plan view, and the sense amplifier region 500 has a lateral dimension along the first horizontal direction hd1 that is in a range from 20% to 70% of a lateral dimension of the memory array region 100 along the first horizontal direction hd1 in the plan view.

In one embodiment, each bit line 982 within the plurality of bit lines 982 has a length along the first horizontal direction hd1 that is in a range from 98% to 102% (such as 100%) of a lateral dimension of the memory array region 100 along the first horizontal direction hd1.

Figure 3:
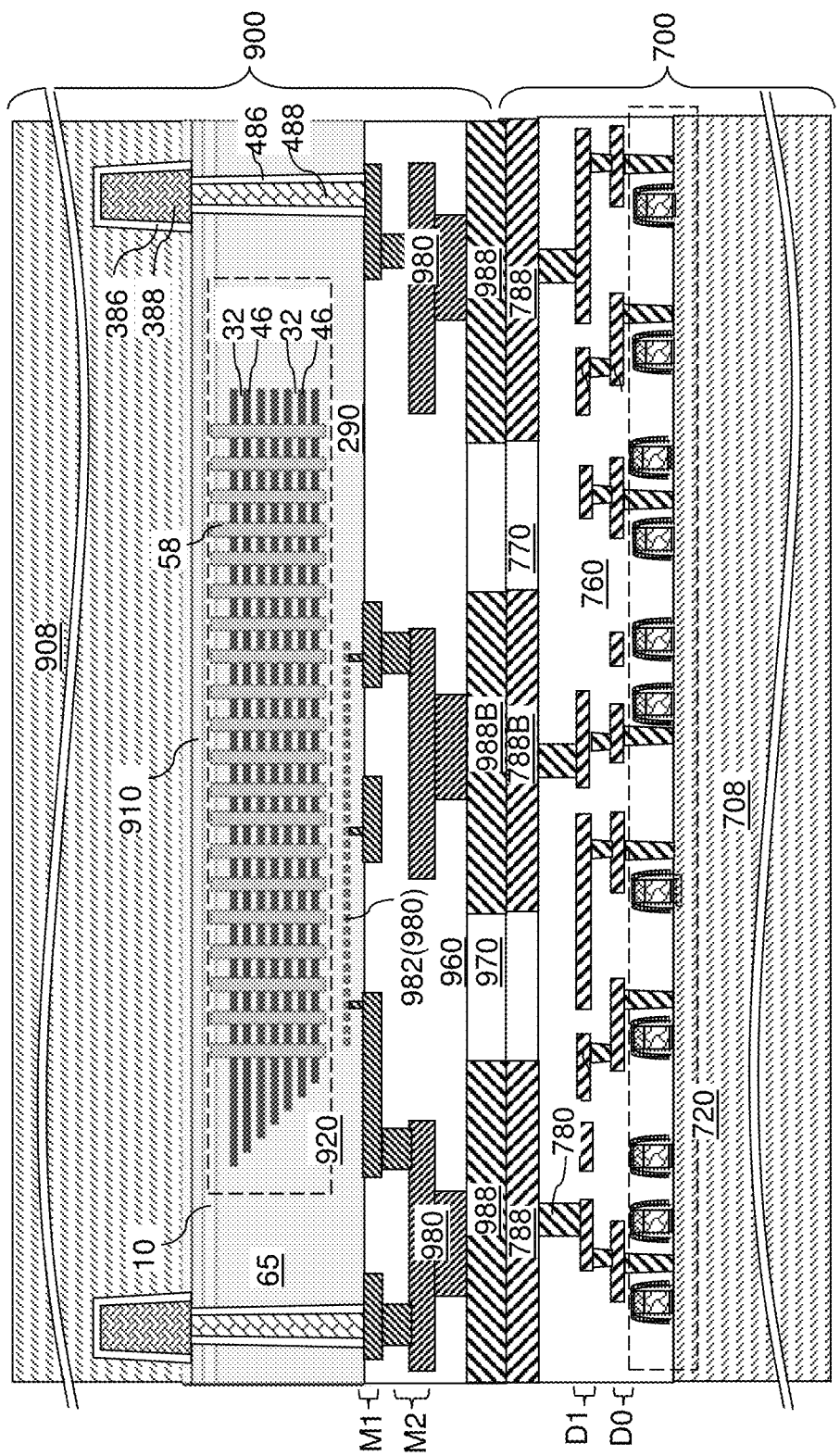
FIG. 3 is a vertical cross-sectional view of a portion of a bonded assembly of the memory die of FIGS. 1A-1C and the logic die of FIGS. 2A and 2B according to an embodiment of the present disclosure.

In the first embodiment shown in FIGS. 5A and 5B, only some of the memory-side bit-line-connection bonding pads 988B are electrically connected to a respective bit line 982 via a metal line 984B which extends in the word line direction hd2 in the metal level M2 (which are shown in FIGS. 4A and 3, respectively). Other memory-side bit-line-connection bonding pads 988B overly their respective bit lines are electrically connected to the respective bit line 982 via a metal line 984A (shown in FIG. 4A) which extends only in the vertical direction and does not extend in the word line direction hd2 in the metal level M2 (shown in FIG. 3). In this first embodiment, the metal line 984 congestion and routing complexity is reduced because only some of the metal lines 984B (rather than all metal lines 984A and 984B) are routed in the word line direction hd2 in the metal level M2.

Thus, according to the first embodiment, the memory-side bit-line-connection bonding pads 988B comprise: first memory-side bit-line-connection bonding pads 988Y electrically connected to, and having an areal overlap with, a respective bit line 982 to which it is electrically connected (via respective interconnect structures 980) within a first subset 982Y of the plurality of bit lines 982 in the plan view; and second memory-side bit-line-connection bonding pads 988Z electrically connected to, not having any areal overlap in the plan view with, and laterally shifted along the second horizontal direction hd2 from, a respective bit line 982 within a second subset 982Z of the bit lines 982.

In one embodiment, each bit line within the first subset 982Y of the plurality of bit lines 982 has an areal overlap with the sense amplifier region 500 in the plan view; and each bit line within the second subset 982Z of the plurality of bit lines 982 does not have any areal overlap with the sense amplifier region 500 in the plan view. In one embodiment, the first subset 982Y of the plurality of bit lines 982 comprises a first fraction of the plurality of bit lines 982 in which the first fraction is in a range from 10% to 90% (such as 50% to 90%); and the second subset 982Z of the plurality of bit lines 982 comprises a second fraction of the plurality of bit lines 982 in which the second fraction is 100% minus the first fraction (e.g., 90% to 10% (such as 50% to 10%)), i.e., the complement of the first fraction.

In one embodiment, each bit line 982 within the second subset 982Z of the bit lines 982 is electrically connected to a respective one of the second memory-side bit-line-connection bonding pads 988Z via a respective metal line 984 (which is a subset of the memory-side metal interconnect structures 980) that laterally extends along the second horizontal direction hd2. In contrast, each bit line 982 within the first subset 982Y of the bit lines 982 is electrically connected to a respective one of the second memory-side bit-line-connection bonding pads 988Y via a respective metal line 984 (which is a subset of the memory-side metal interconnect structures 980) that does not laterally extend along the second horizontal direction hd2 and may extend only in the vertical direction which is perpendicular to the major surface of the substrate 908. In one embodiment, the metal lines 984 electrically connecting a respective pair of a bit line 982 within the second subset 982Z of the bit lines 982 and a respective one of the second memory-side bit-line-connection bonding pads 988Z is vertically spaced from the logic die 700 by a vertical separation distance that is less than a vertical distance between the logic die 700 and the plurality of bit lines 982. In other words, the metal lines 984 can be located at a higher level within the memory die 900 than the bit lines 982.

In one embodiment, each of the memory stack structures 55 comprises: a vertical stack of memory elements (such as portions of the memory material layer 54) located at levels of the electrically conductive layers 46; and a vertical semiconductor channel 60 vertically extending through the electrically conductive layers 46 adjacent to the vertical stack of memory elements and is adjoined to a drain region 63 at an end that is proximal to the logic die 700.

According to a second embodiment of the present disclosure, the layout of the sense amplifier region 500 may be rotated by 90 degrees in the plan view. Referring to FIGS. 6A and 6B, a second configuration for the bonded assembly of a memory die 900 and a logic die 700 is provided, which can be derived from the bonded assembly illustrated in FIGS. 3, 4A-4C, 5A, and 5B by altering the layout for the memory-side bonding pads 988, the logic-side bonding pads 788, the sense amplifier region 500, the memory-side metal interconnect structures 980, and the logic-side metal interconnect structures 780. The layout for the bit lines 982 can be the same as in the bonded assembly illustrated in FIGS. 3, 4A-4C, 5A, and 5B. The sense amplifier region 500 can be elongated along the bit line direction, such that it is longer in the bit line direction (i.e., the first horizontal direction) hd1 than in the word line direction (i.e., the second horizontal direction) hd2.

In this case, the sense amplifier region 500 can be laterally spaced from the word line driver region 600 in the plan view. The sense amplifier region 500 can have a lateral dimension along the first horizontal direction hd1 that is in a range from 98% to 102% (such as 100%) of a lateral dimension of the memory array region 100 along the first horizontal direction hd1 in the plan view. The sense amplifier region 500 has a lateral dimension along the second horizontal direction hd2 that is in a range from 20% to 70% of a lateral dimension of the memory array region 100 along the second horizontal hd2 direction in the plan view.

In one embodiment, the memory-side bit-line-connection bonding pads 988B comprise: first memory-side bit-line-connection bonding pads 988Y electrically connected to, and having an areal overlap with, a respective bit line 982 within a first subset 982Y of the plurality of bit lines 982 in the plan view; and second memory-side bit-line-connection bonding pads 988Z electrically connected to, not having any areal overlap in the plan view with, and laterally shifted along the second horizontal direction hd2 from, a respective bit line 982 within a second subset 982Z of the bit lines 982.

In one embodiment, each bit line within the first subset 982Y of the plurality of bit lines 982 has an areal overlap with the sense amplifier region 500 in the plan view; and each bit line within the second subset 982Z of the plurality of bit lines 982 does not have any areal overlap with the sense amplifier region 500 in the plan view. In one embodiment, the first subset 982Y of the plurality of bit lines 982 comprises a first fraction of the plurality of bit lines 982 in which the first fraction is in a range from 10% to 90% (such as from 10% to 30%); and the second subset 982Z of the plurality of bit lines 982 in which the second fraction is 100% minus the first fraction (e.g., 90% to 10% (such as 50% to 10%)), i.e., the complement of the first fraction.

In one embodiment, each bit line 982 within the second subset 982Z of the bit lines 982 is electrically connected to a respective one of the second memory-side bit-line-connection bonding pads 988Z via a respective metal line 984B (which is a subset of the memory-side metal interconnect structures 980 and shown in FIG. 4A) that laterally extends along the second horizontal direction hd2. In contrast, each bit line 982 within the first subset 982Y of the bit lines 982 is electrically connected to a respective one of the second memory-side bit-line-connection bonding pads 988Y via a respective metal line 984A (which is a subset of the memory-side metal interconnect structures 980 and shown in FIG. 4A) that does not laterally extend along the second horizontal direction hd2 and may extend only in the vertical direction which is perpendicular to the major surface of the substrate 908.

In one embodiment, the metal lines 984 electrically connecting a respective pair of a bit line 982 within the second subset 982Z of the bit lines 982 and a respective one of the second memory-side bit-line-connection bonding pads 988Z is vertically spaced from the logic die 700 by a vertical separation distance that is less than a vertical distance between the logic die 700 and the plurality of bit lines 982. In other words, the metal lines 984 can be located at a higher level within the memory die 900 than the bit lines 982.

FIGS. 7A-7C illustrate plan views of a plane of a memory die 900 and a corresponding portion of a logic die 700 for alternative configurations of the bonded assembly according to embodiments of the present disclosure.

Referring to FIG. 7A, a configuration for the bonded assembly of a memory die 900 and a logic die 700 can be derived from the second configuration of the bonded assembly illustrated in FIGS. 6A and 6B by dividing the memory array region 100 into a plurality of memory array sub-regions 100_j, in which j is a suffix distinguishing the various memory array sub-regions 100_j. Specifically, each sub-region 100_j may comprise a memory block. In one example shown in FIG. 7B, the memory plane is divided into four blocks 100_A to 100_D with two sense amplifier sub-regions (e.g., circuits) 500_1 and 500_2 in the logic die 700, such that each sense amplifier circuit is connected to two of the four blocks. In another example shown in FIG. 7C, the memory plane is divided into eight blocks 100_A to 100_Z with eight sense amplifier sub-regions (e.g., circuits) 500_1 to 500_i in the logic die 700, such that each sense amplifier circuit is connected to a respective block.

The mating pairs of memory-side bit-line-connection bonding pads 988B and logic-side bit-line-connection bonding pads 788B may be grouped for each memory array sub-region 100_j. Alternatively or additionally, the mating pairs of memory-side bit-line-connection bonding pads 988B and logic-side bit-line-connection bonding pads 788B may be arranged as pairs of diagonal rows to prevent intersection of the metal lines 984 and to provide efficient electrical wiring.

Referring to FIGS. 7B and 7C, the sense amplifier region 500 may comprise a plurality of sense amplifier sub-regions 500_i, in which i is a suffix employed to distinguish the different sense amplifier sub-regions 500_i. Each sense amplifier sub-region 500_i includes a respective subset of the sense amplifiers and are laterally spaced from each other. As used herein, a "sense amplifier sub-region" refers to a region that includes a subset of sense amplifiers that is less than the entire set of sense amplifiers for a plane.

In one embodiment, each of the plurality of sense amplifier sub-regions 500_i has an areal overlap with a respective subset the plurality of bit lines 982 in the plan view; and a subset of the plurality of bit lines 982 does not have an areal overlap with the sense amplifier region (which is a union of all of the sense amplifier sub-regions 500_i) in the plan view.

In one embodiment, each bit line 982 that does not have an areal overlap with the sense amplifier region in the plan view is electrically connected to a respective one of the memory-side bit-line-connection bonding pads 988Z via a metal line 984 that laterally extends along the second horizontal direction hd2.

In one embodiment, the sense amplifier region (which is a union of all sense amplifier sub-regions 500_i) comprises a total of N sense amplifier sub-regions in which N is an integer greater than 1. For example, N may be in a range from, and including, 2 to, and including, 64. In one embodiment, each metal line 984 that interconnects a respective pair of a bit line 982 that does not have an areal overlap with the sense amplifier region in the plan view and a memory-side bit-line-connection bonding pad 988Z has a lateral dimension along the second horizontal direction hd2 that is not greater than a lateral dimension of the memory array region 100 along the second horizontal direction hd2 divided by 2N. This configuration can be provided by dividing the memory array region 100 into 2N memory array sub-regions 100_j having a length along the first horizontal direction hd1 that is the same as the length of the memory array region 100, and having a width along the second horizontal direction hd2 that is the width of the memory array region 100 divided by 2N.

The various embodiments of the present disclosure may reduce the chip size and provide freedom of placement of sense amplifier and other peripheral circuit blocks. The embodiments provide a more efficient chip floorplan including circuit placement and power/signal line management. The chip size may be reduced by placing at least a portion of the word line driver circuit 600 under (i.e., in overlapping relationship) with the memory array region 100 in the bonded assembly. The configuration of the second embodiment also provides a better management of a power/signal line as it provides a free vertical area for power/signal connection.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly, comprising:

a memory die; and a logic die that is bonded to the memory die, wherein:

the memory die comprises:

a memory array containing a memory array region;

a plurality of bit lines that are located within the memory array region, and that laterally extend along a first horizontal direction and laterally spaced apart along a second horizontal direction, and memory-side bit-line-connection bonding pads electrically connected to the plurality of bit lines; and the logic die comprises:

sense amplifiers located in a sense amplifier region, and logic-side bit-line-connection bonding pads located within the sense amplifier region and bonded to a respective one of the memory-side bit-line-connection bonding pads;

wherein:

the sense amplifier region has an areal overlap with a respective first subset of the plurality of bit lines in a plan view;

a second subset of the plurality of bit lines does not have an areal overlap with the sense amplifier region in the plan view;

each bit line of the respective first subset that has the areal overlap with the sense amplifier region in the plan view is electrically connected to a respective one of the memory-side bit-line-connection bonding pads via a metal line that does not laterally extend along the second horizontal direction; and each bit line of the second subset that does not have the areal overlap with the sense amplifier region in the plan view is electrically connected to a respective one of the memory-side bit-line-connection bonding pads via a metal line that laterally extends along the second horizontal direction.

2. The bonded assembly of claim 1, wherein:

the memory array comprises a three-dimensional memory array that includes an alternating stack of insulating layers and electrically conductive layers, and includes memory stack structures vertically extending through the alternating stack in the memory array region in which each layer within the alternating stack is present;

the alternating stack comprises a staircase region in which lateral extents of the electrically conductive layers along the second horizontal direction increase with a vertical distance from the logic die; and word-line-contact via structures contact a respective one of the electrically conductive layers in the staircase region and extends toward the logic die.

3. The bonded assembly of claim 2, wherein the logic die comprises a word line driver circuit located within a word line driver region that includes an entire area of the staircase region and has a greater lateral dimension along the second horizontal direction than the staircase region in the plan view.

4. The bonded assembly of claim 3, wherein the word line driver region has an areal overlap with the memory array region in the plan view.

5. The bonded assembly of claim 3, wherein:

the memory die comprises memory-side word-line-connection bonding pads that are electrically connected to the word-line-contact via structures; and the logic die comprises logic-side word-line-connection bonding pads that are bonded to the memory-side word-line-connection bonding pads and electrically connected to output nodes of the word line driver circuit via logic-side metal interconnect structures.

6. The bonded assembly of claim 3, wherein the word line driver region that has a partial overlap with the memory array region in the plan view.

7. The bonded assembly of claim 3, wherein:

the sense amplifier region borders the word line driver region in the plan view; and the sense amplifier region has a lateral dimension along the first horizontal direction that is in a range from 20% to 70% of a lateral dimension of the memory array region along the first horizontal direction in the plan view.

8. The bonded assembly of claim 3, wherein:
the sense amplifier region is laterally spaced from the word line driver region in the plan view;
the sense amplifier region has a lateral dimension along the first horizontal direction that is in a range from 98% to 102% of a lateral dimension of the memory array region along the first horizontal direction in the plan view; and
the sense amplifier region has a lateral dimension along the second horizontal direction that is in a range from 20% to 70% of a lateral dimension of the memory array region along the second horizontal direction in the plan view.

9. The bonded assembly of claim 1, wherein the sense amplifier region is located entirely within and has a lesser lateral extent along the second horizontal direction than an area of the memory array region in a plan view along a vertical direction.

10. The bonded assembly of claim 9, wherein the sense amplifier region is longer in the first horizontal direction than in the second horizontal direction.

11. The bonded assembly of claim 1, wherein:
the sense amplifier region comprises a plurality of laterally spaced apart sense amplifier sub-regions including a respective subset of the sense amplifiers;
each of the plurality of sense amplifier sub-regions has an areal overlap with a respective portion of the first subset the plurality of bit lines in the plan view; and
the second subset of the plurality of bit lines that does not have an areal overlap with the sense amplifier region also does not have an areal overlap with the sense amplifier sub-regions in the plan view.

12. The bonded assembly of claim 11, wherein:
the sense amplifier region comprises a total of N sense amplifier sub-regions in which N is an integer greater than 1; and
each metal line that interconnects a respective pair of a bit line of the second subset that does not have an areal overlap with the sense amplifier region in the plan view and a memory-side bit-line-connection bonding pad has a lateral dimension along the second horizontal direction that is not greater than a lateral dimension of the memory array region along the second horizontal direction divided by 2N.

13. The bonded assembly of claim 1, wherein each bit line within the plurality of bit lines has a length along the first horizontal direction that is in a range from 98% to 102% of a lateral dimension of the memory array region along the first horizontal direction.

14. The bonded assembly of claim 1, wherein the memory-side bit-line-connection bonding pads comprise:
first memory-side bit-line-connection bonding pads electrically connected to and having an areal overlap with a respective bit line within the first subset of the plurality of bit lines in the plan view; and
second memory-side bit-line-connection bonding pads electrically connected to, not having any areal overlap in the plan view with, and laterally shifted along the second horizontal direction from, a respective bit line within the second subset of the bit lines.

15. The bonded assembly of claim 14, wherein:
each bit line within the first subset of the plurality of bit lines has the areal overlap with the sense amplifier region in the plan view; and
each bit line within the second subset of the plurality of bit lines does not have any areal overlap with the sense amplifier region in the plan view.

16. The bonded assembly of claim 14, wherein:
the first subset of the plurality of bit lines comprises a first fraction of the plurality of bit lines in which the first fraction is in a range from 10% to 90%; and
the second subset of the plurality of bit lines comprises a second fraction of the plurality of bit lines in which the second fraction is 100% minus the first fraction.

17. The bonded assembly of claim 14, wherein each bit line within the second subset of the plurality of bit lines is electrically connected to a respective one of the second memory-side bit-line-connection bonding pads via a respective metal line that laterally extends along the second horizontal direction.

18. The bonded assembly of claim 17, wherein the metal lines electrically connecting a respective pair of a bit line within the second subset of the bit lines and a respective one of the second memory-side bit-line-connection bonding pads is vertically spaced from the logic die by a vertical separation distance that is less than a vertical distance between the logic die and the plurality of bit lines.

19. The bonded assembly of claim 2, wherein each of the memory stack structures comprises:
a vertical stack of memory elements located at levels of the electrically conductive layers; and
a vertical semiconductor channel vertically extending through the electrically conductive layers adjacent to the vertical stack of memory elements and is adjoined to a drain region at an end that is proximal to the logic die.

* * * * *